(12) United States Patent
Kishioka et al.

(10) Patent No.: US 7,595,144 B2
(45) Date of Patent: Sep. 29, 2009

(54) SULFONATE-CONTAINING ANTI-REFLECTIVE COATING FORMING COMPOSITION FOR LITHOGRAPHY

(75) Inventors: Takahiro Kishioka, Toyama (JP); Tadashi Hatanaka, Toyama (JP); Shigeo Kimura, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 93 days.

(21) Appl. No.: 11/666,080

(22) PCT Filed: Oct. 25, 2005

(86) PCT No.: PCT/JP2005/019612

§ 371 (c)(1), (2), (4) Date: May 1, 2007

(87) PCT Pub. No.: WO2006/049045

PCT Pub. Date: May 11, 2006

(65) Prior Publication Data

US 2008/0003524 A1 Jan. 3, 2008

(30) Foreign Application Priority Data

Nov. 1, 2004 (JP) .............................. 2004-318132

(51) Int. Cl.
*G03F 7/11* (2006.01)
(52) U.S. Cl. ................. 430/311; 430/272.1; 430/271.1; 430/326; 525/418; 525/423; 525/427; 525/480; 525/481; 522/27; 522/59; 438/952
(58) Field of Classification Search ........................ None
See application file for complete search history.

(56) References Cited

U.S. PATENT DOCUMENTS

| 5,344,742 | A | * | 9/1994 | Sinta et al. ................ 430/270.1 |
| 5,939,236 | A | * | 8/1999 | Pavelchek et al. ......... 430/273.1 |
| 2002/0012875 | A1 | | 1/2002 | Pavelchek et al. |
| 2002/0156148 | A1 | | 10/2002 | Arase et al. |
| 2004/0121260 | A1 | | 6/2004 | Nakamura et al. |
| 2006/0216652 | A1 | | 9/2006 | Kishioka et al. |

FOREIGN PATENT DOCUMENTS

| EP | 1 237 042 A2 | 9/2002 |
| EP | 1 378 796 A1 | 1/2004 |
| JP | 2004-126161 A * | 4/2004 |
| WO | WO-2005/098542 A1 * | 10/2005 |

OTHER PUBLICATIONS

English translation of JP, 2004-126161, A (2004) from machine translation from AIPN Japan Patent Office Natinal center for Industrial Property Information and Training, generated Dec. 14, 2008, 23 pages.*

* cited by examiner

*Primary Examiner*—Cynthia Hamilton
(74) *Attorney, Agent, or Firm*—Oliff & Berridge, PLC

(57) ABSTRACT

There is provided an anti-reflective coating forming composition for lithography comprising a polymer compound, a crosslinking compound, a crosslinking catalyst, a sulfonate compound and a solvent. The anti-reflective coating obtained from the composition has a high preventive effect for reflected light, causes no intermixing with photoresists, has a higher dry etching rate compared with photoresists, can form a photoresist pattern having no footing at the lower part, and can use in lithography process by use of a light such as ArF excimer laser beam and F2 excimer laser beam, etc.

12 Claims, No Drawings

US 7,595,144 B2

SULFONATE-CONTAINING ANTI-REFLECTIVE COATING FORMING COMPOSITION FOR LITHOGRAPHY

TECHNICAL FIELD

The present invention relates to an anti-reflective coating forming composition for lithography that is used in lithography process for manufacturing a semiconductor device. Specifically, the present invention relates to an anti-reflective coating forming composition for lithography for forming an anti-reflective coating applied under a photoresist, which is used for reducing reflection of irradiation light for exposing from a semiconductor substrate. Further, the present invention relates to a method for forming photoresist pattern by use of the anti-reflective coating forming composition for lithography.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer substrate or the like, irradiating actinic rays such as ultraviolet rays through a mask pattern on which a pattern for the device is depicted, developing it to obtain a photoresist pattern, and etching the substrate using the photoresist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, reflection of irradiation light from a substrate have become problems. Accordingly, it has been widely studied to provide an anti-reflective coating (bottom anti-reflective coating) between the photoresist and the substrate.

As the anti-reflective coatings, inorganic anti-reflective coatings made of titanium dioxide, titanium nitride, and carbon, etc. and organic anti-reflective coatings made of a light absorbing substance and a polymer compound, etc. are known. The former requires an installation such as a vacuum deposition apparatus, a CVD apparatus or a sputtering apparatus, etc. In contrast, the latter is considered advantageous in that it requires no special installation so that many studies have been made.

It is desired for organic anti-reflective coatings to have high absorbance to light used for exposure, no intermixing with photoresists (being insoluble in photoresist solvents), no diffusion of low molecular weight compounds from the anti-reflective coating material into the topcoat photoresist on application or drying under heating, and a higher dry etching rate than the photoresist, and so on.

It is also requested for anti-reflective coatings to be able to form a photoresist pattern having a good shape. In particular, it is required to be able to form a photoresist pattern having no footing at the lower part. This is because the photoresist pattern having footing exerts adverse effects on the following processing steps.

In recent years, miniaturization of process size in a lithography process by use of KrF excimer laser beam or ArF excimer laser beam, that is, miniaturization of formed photoresist pattern size is advanced. In order to prevent collapse or the like of photoresist pattern that is accompanied with miniaturization of photoresist pattern, it is desired to make the photoresist thinner. In addition, when the photoresist is used in a form of thin film, in order to inhibit decrease in film thickness of photoresist layer in the process of removing anti-reflective coating used together by etching, it is desired that the anti-reflective coating can be removed by etching for a shorter time. That is, in order to make the time required for an etching removing step shorter, there are demands for anti-reflective coatings that can be used in a form of thinner film compared with the conventional ones, or for anti-reflective coatings having a higher selection ratio of etching rate to photoresists compared with the conventional one.

In addition, the kinds of photoresists used increase with the progress of lithography technique. Therefore, it is always desired to develop novel anti-reflective coatings in order to adapt to the use of the diverse photoresists.

In the meanwhile, anti-halation compositions containing a binder resin, a crosslinking compound and an acid, and the like are known (see, for example Patent Documents 1 and 2). In addition, an anti-reflective coating material composition containing a polymer, a thermal crosslinking agent and a sulfonate compound which starts to generate an acid at 150 to 200° C. by decomposition is known (see, for example Patent Document 3).

In addition, a composition for an anti-reflective coating by use of a reaction product from an epoxy compound is known (see, for example Patent Documents 4 and 5). Further, a composition for an anti-reflective coating containing a compound having a triazine trione ring structure is known (see, for example Patent Document 6).

Patent Document 1: JP-A-118631 (1994)
Patent Document 2: JP-A-11-133618 (1999)
Patent Document 3: JP-A-2000-98595 (2000)
Patent Document 4: US-B-6670425 (2003)
Patent Document 5: JP-A-2004-212907 (2004)
Patent Document 6: WO 04/034148 Pamphlet (2004)

DISCLOSURE OF INVENTION

Problem to be Solved by the Invention

An object of the present invention is to provide an anti-reflective coating composition for lithography that can be used in lithography process for manufacturing a semiconductor device by use of irradiation light of KrF excimer laser beam (wavelength 248 nm), ArF excimer laser beam (wavelength 193 nm) or F2 excimer laser beam (wavelength 157 nm).

Another object of the present invention is to provide an anti-reflective coating for lithography that effectively absorbs light reflected from a substrate, causes no intermixing with a photoresist layer and has a higher dry etching rate compared with a photoresist, when KrF excimer laser beam, ArF excimer laser beam or F2 excimer laser beam is used for fine processing, and to provide an anti-reflective coating forming composition for forming the anti-reflective coating.

Other object of the present invention is also to provide an anti-reflective coating for lithography that can form a photoresist pattern having a good shape, and an anti-reflective coating forming composition that is used therefor.

Further, an object of the present invention is to provide a method for forming anti-reflective coating for lithography and a method for forming photoresist pattern, by use of the anti-reflective coating forming composition.

Means for Solving the Problem

Taking the above-mentioned present status into account, the present inventors have eagerly studied, as a result of it they found that an excellent anti-reflective coating can be formed by using a composition containing a polymer compound, a crosslinking compound, a crosslinking catalyst and a sulfonate compound and a solvent, and completed the present invention.

That is, as a first aspect, the present invention relates to an anti-reflective coating forming composition for lithography characterized by comprising a polymer compound, a crosslinking compound, a crosslinking catalyst, a sulfonate compound and a solvent.

As a second aspect, the present invention relates to the anti-reflective coating forming composition for lithography as described in the first aspect, wherein the polymer compound is a polymer compound having an aromatic hydrocarbon ring structure selected from the group consisting of a benzene ring, a naphthalene ring and an anthracene ring.

As a third aspect, the present invention relates to the anti-reflective coating forming composition for lithography as described in the first aspect, wherein the polymer compound is a polymer compound having a nitrogen-containing ring structure selected from the group consisting of a triazine trione ring, an imidazolidine dione ring, 2,5-pyrrolidine dione ring and a pyrimidine trione ring.

As a fourth aspect the present invention relates to the anti-reflective coating forming composition for lithography as described in the first aspect, wherein the polymer compound is a polymer compound having a repeated structural unit of formula (1):

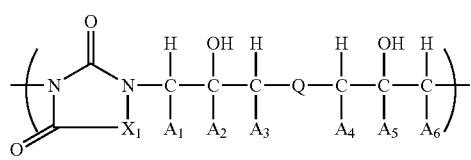

(1)

wherein $A_1$, $A_2$, $A_3$, $A_4$, $A_5$, and $A_6$ independently of one another are hydrogen atom, methyl or ethyl, $X_1$ is a group of formula (2), (3) or (4):

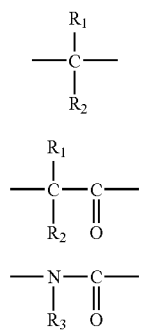

(2)

(3)

(4)

wherein $R_1$ and $R_2$ independently of each other are hydrogen atom, $C_{1-6}$alkyl, $C_{3-6}$alkenyl, benzyl or phenyl, and the phenyl may be substituted with a group selected from the group consisting of $C_{1-6}$alkyl, halogen atom, $C_{1-6}$alkoxy, nitro, cyano, hydroxy and $C_{1-6}$alkylthio, or $R_1$ and $R_2$ may form $C_{3-6}$ring by linking each other, $R_3$ is $C_{1-6}$alkyl, $C_{3-6}$alkenyl, benzyl or phenyl, and the phenyl may be substituted with a group selected from the group consisting of $C_{1-6}$alkyl, halogen atom, $C_{1-6}$alkoxy, nitro, cyano, hydroxy and $C_{1-6}$alkylthio, Q is a group of formula (5) or (6):

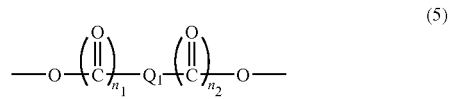

(5)

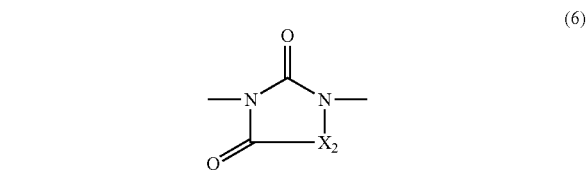

(6)

wherein $Q_1$ is $C_{1-10}$alkylene, phenylene, naphthylene or anthrylene, and each of the phenylene, naphthylene and anthrylene may be substituted with a group selected from the group consisting of $C_{1-6}$alkyl, halogen atom, $C_{1-6}$alkoxy, nitro, cyano, hydroxy and $C_{1-6}$alkylthio, each of $n_1$ and $n_2$ is a number of 0 or 1, $X_2$ is a group of formula (2) or (3).

As a fifth aspect, the present invention relates to the anti-reflective coating forming composition for lithography as described in the first aspect, wherein the crosslinking compound is a nitrogen-containing compound having a nitrogen atom substituted with hydroxymethyl or alkoxymethyl.

As a sixth aspect, the present invention relates to the anti-reflective coating forming composition for lithography as described in the first aspect, wherein the crosslinking catalyst is a sulfonic acid compound.

As a seventh aspect, the present invention relates to the anti-reflective coating forming composition for lithography as described in the first aspect, wherein the sulfonate compound is an alkylsulfonate compound having $C_{1-10}$alkyl.

As an eighth aspect, the present invention relates to the ant-reflective coating forming composition for lithography as described in the first aspect, wherein the sulfonate compound is an aromatic sulfonate compound.

As a ninth aspect, the present invention relates to the anti-reflective coating forming composition for lithography as described in the eighth aspect, wherein the aromatic sulfonate compound is a compound having a structure of formula (7):

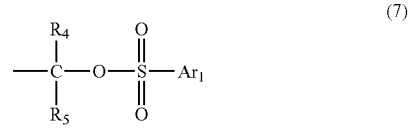

(7)

wherein $Ar_1$ is a benzene ring, a naphthalene ring or an anthracene ring that may be substituted with a group selected from the group consisting of $C_{1-6}$alkyl, $C_{1-6}$alkoxy, hydroxy, nitro, cyano, amino, halogen, carboxy and $C_{1-6}$alkoxycarbonyl, $R_4$ and $R_5$ independently of each other are hydrogen atom or $C_{1-5}$alkyl, or $R_4$ and $R_5$ may form $C_{3-6}$ring by linking each other.

As a tenth aspect, the present invention relates to the anti-reflective coating forming composition for lithography as described in the ninth aspect, wherein the aromatic sulfonate compound is a compound having two to four of the structure of formula (7).

As an eleventh aspect, the present invention relates to the anti-reflective coating forming composition for lithography as described in the eighth aspect, wherein the aromatic sulfonate compound is a toluene sulfonate compound.

As a twelfth aspect, the present invention relates to the anti-reflective coating forming composition for lithography as described in the first aspect, wherein the sulfonate compound is a sulfonate compound having 10% weight loss temperature of 170° C. or more by thermogravimetry.

As a thirteenth aspect, a method for forming photoresist pattern for use in manufacture of semiconductor device, comprising the steps of:
coating the anti-reflective coating forming composition as described in any one of the first to twelfth aspects on a semiconductor substrate, and baking it to form an anti-reflective coating,
forming a photoresist layer on the anti-reflective coating, exposing the semiconductor substrate covered with the anti-reflective coating and the photoresist layer to light, and
developing the photoresist layer after the exposure to light.

EFFECT OF THE INVENTION

The anti-reflective coating forming composition for lithography according to the present invention is a composition for forming an anti-reflective coating having a strong absorption to a light having a short wavelength, particularly KrF excimer laser beam (wavelength 248 nm), ArF excimer laser beam (wavelength 193 nm) or F2 excimer laser beam (wavelength 157 nm). The anti-reflective coating obtained therefrom effectively absorbs a light reflected from a substrate.

The present invention can provide an anti-reflective coating that effectively absorbs a light reflected from a semiconductor substrate in fine processing by use of KrF excimer laser beam and ArF excimer laser beam or the like, and that causes no intermixing with a photoresist layer.

The present invention can provide an anti-reflective coating having a high etching rate compared with photoresists.

Further, the use of the anti-reflective coating of the present invention obtained from the anti-reflective coating forming composition according to the present invention makes possible to form a photoresist pattern having a good shape in lithography process by use of KrF excimer laser beam and ArF excimer laser beam or the like.

BEST MODE FOR CARRYING OUT THE INVENTION

The anti-reflective coating forming composition for lithography according to the present invention comprises a polymer compound, a crosslinking compound, a crosslinking catalyst, a sulfonate compound and a solvent. In addition, the anti-reflective coating forming composition for lithography according to the present invention can comprise a photoacid generator and a surfactant or the like. And, the proportion of solid content in the anti-reflective coating forming composition is not specifically limited so long as each component homogeneously dissolves in the solvent, for example it is 0.5 to 50 mass %, or 1 to 30 mass %, or 3 to 25 mass %, or 5 to 15 mass %. In this specification, the solid content means all components of the anti-reflective coating forming composition from which the solvent component is excluded.

Hereinafter, the anti-reflective coating forming composition for lithography according to the present invention will be described.

The anti-reflective coating forming composition for lithography according to the present invention contains a polymer compound. The polymer compound can be used without specific limitation. Polymer compounds so far used for the anti-reflective coatings can be used. For example, polymer compounds such as polyester, polystyrene, polylmide, acrylic polymer, methacrylic polymer, polyvinyl ether, phenol novolak, naphthol novolak, polyether, polyamide, and polycarbonate, and so on can be used.

From the viewpoint of the light absorbing property of the formed anti-reflective coating, as the polymer compound contained in the anti-reflective coating forming composition for lithography according to the present invention, polymer compounds having an aromatic ring structure can be used. The aromatic ring structure includes an aromatic hydrocarbon ring structure such as benzene ring, naphthalene ring, anthracene ring and naphthacene ring, etc. The aromatic ring structure also includes an aromatic hetero ring structure such as pyridine ring, thiophene ring, thiazole ring, quinoline ring, quinoxaline ring, benzothiazole ring, and acridine ring, etc. When the polymer compound has an aromatic ring structure, the compound may have one kind of or two or more kinds of the aromatic ring structure.

In addition, as the polymer compound contained in the anti-reflective coating forming composition for lithography according to the present invention, polymers having hydroxy or carboxy can be used from the viewpoint of crosslinking property with the crosslinking compound. As the polymer compound contained in the anti-reflective coating forming composition for lithography according to the present invention, polymer compounds having the aromatic ring structure and hydroxy, and polymer compounds having the aromatic ring structure and carboxy can be used.

The polymer compounds having benzene ring structure as aromatic ring structure include polymer compounds that can be synthesized by polymerization by use of a compound having benzene ring such as benzyl acrylate, benzyl methacrylate, phenyl acrylate, styrene, hydroxy styrene, benzyl vinyl ether and N-phenyl maleimide, etc., as a monomer compound.

In addition, the polymer compounds having naphthalene ring structure as aromatic ring structure include polymer compounds that can be synthesized by polymerization by use of a compound having naphthalene ring such as naphthyl acrylate, naphthyl methyl methacrylate and vinyl naphthalene, etc., as a monomer compound.

Further, the polymer compounds having anthracene ring structure as aromatic ring structure include polymer compounds that can be synthesized by polymerization by use of a compound having anthracene ring such as anthryl methacrylate, anthryl methyl methacrylate and vinyl anthracene, etc., as a monomer compound.

As the polymer compound contained in the anti-reflective coating forming composition for lithography according to the present invention, polymer compounds having the repeated structural unit selected from formulae (8) to (11) described below in a proportion of 10 to 100%, or 20 to 95%, or 25 to 75%, or 30 to 50% based on the whole repeated structural units constituting the polymer compounds can be used. In formulae (8) to (11), $R_6$ is hydrogen atom or methyl, $m_1$ is a number of 0, 1 or 2. And, $Ar_2$ is benzene ring, naphthalene ring or anthracene ring that may be substituted with a group selected from the group consisting of $C_{1-6}$alkyl, $C_{1-6}$alkoxy, hydroxy, fluorine atom, chlorine atom, bromine atom, iodine atom, cyano and nitro. In this specification, $C_{1-6}$alkyl includes methyl, ethyl, isopropyl, cyclopentyl, n-hexyl and isobutyl, etc. $C_{1-6}$alkoxy includes methoxy, ethoxy, isopropoxy and cyclohexenyl, etc. The structure of formulae (8) and (11) can be introduced in the polymer compound by using a monomer compound such as benzyl methacrylate, anthryl methylmethacrylate and styrene, etc.

The structure of formulae (9) and (10) can be obtained by synthesizing a polymer compound by use of glycidyl acrylate or glycidyl methacrylate, and then reacting the epoxy ring moiety with a phenol compound ($Ar_2$—OH) or a carboxylic acid compound ($Ar_2$—COOH). The structure can be also synthesized for example with reference to U.S. Pat. No. 5,919,599.

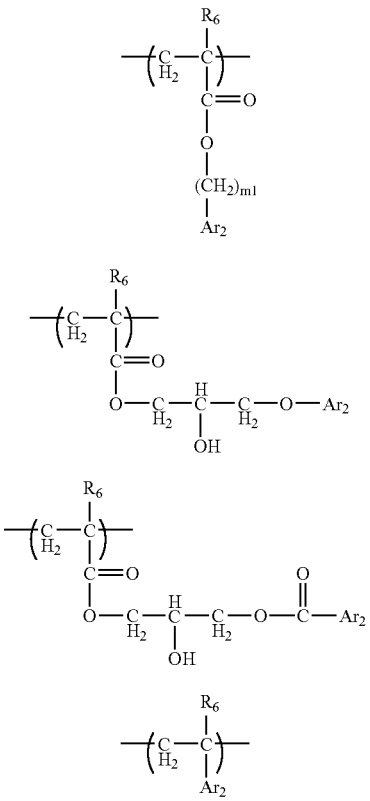

As the polymer compound contained in the anti-reflective coating forming composition for lithography according to the present invention, polymer compounds having the repeated structural unit selected from formulae (12) to (14), and other repeated structural unit together with the repeated structural unit selected from formulae (8) to (11) can be used. In formula (13), $R_7$ is hydrogen atom, methyl, ethyl or hydroxymethyl.

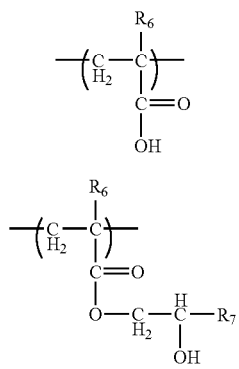

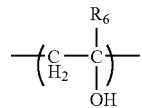

When the polymer compound contained in the anti-reflective coating forming composition for lithography according to the present invention has the repeated structural unit selected from formulae (12) to (14), and other repeated structural unit together with the repeated structural unit selected from formulae (8) to (11), the proportion thereof (in case where the repeated structural unit selected from formulae (12) to (14), and other repeated structural unit together are contained, the proportion of the sum thereof) is 90% or less, for example 5 to 90%, or 25 to 75%, or 50 to 70% based on the whole repeated structural units constituting the polymer compound.

The structure of formulae (12) to (14) can be introduced in the polymer compound by use of a monomer compound such as acrylic acid, methacrylic acid, hydroxyethyl acrylate, hydroxyethyl methacrylate, 2-hydroxypropyl methacrylate, 2-hydroxypropyl acrylate, 2,3-dihydroxypropyl methacrylate and vinylalcohol, etc.

Other repeated structural units can be introduced in the polymer compound by use of polymerizable monomer compounds such as acrylate compounds, methacrylate compounds, acrylamide compounds, methacrylamide compounds, vinyl compounds, maleimide compounds, maleic anhydride, and acrylonitrile, etc.

The acrylate compounds include methyl acrylate, ethyl acrylate, isopropyl acrylate, 2,2,2-trifluoroethyl acrylate, 4-hydroxybutyl acrylate, isobutyl acrylate, cyclohexyl acrylate, α-acryloyloxy-γ-butyrolactone, isobornyl acrylate, 2-methoxyethyl acrylate, methoxytriethylene glycol acrylate, 2-ethoxyethyl acrylate, tetrahydrofuryl acrylate, 2-methyl-adamantyl acrylate, and 8-methyl-8-tricylcodecyl acrylate, etc.

The methacrylate compounds include ethyl methacrylate, n-propyl methacrylate, n-pentyl methacrylate, cyclohexyl methacrylate, 2,2,2-trifluoroethyl methacrylate, 2,2,2-trichloroethyl methacrylate, isodecyl methacrylate, n-butoxyethyl methacrylate, 3-chloro-2-hydroxypropyl methacrylate, 2-methyl-2-adamantyl methacrylate, α-methacryloyloxy-γ-butyrolactone and 2,2,3,3,4,4,4-heptafluorobutyl methacrylate, etc.

The acrylamide compounds include acrylamide, N-methyl acrylamide, N-ethyl acrylamide, N-benzyl acrylamide, N-phenyl acrylamide, and N,N-dimethyl acrylamide, etc.

The methacrylamide compounds include methacrylamide, N-methyl methacrylamide, N-ethyl methacrylamide, N-benzyl methacrylamide, N-phenyl methacrylamide, and N,N-dimethyl methacrylamide, etc.

The vinyl compounds include methyl vinyl ether, benzyl vinyl ether, 2-hydroxyethyl vinyl ether, phenyl vinyl ether, 1-vinyl naphthalene, 2-vinyl naphthalene, 9-vinyl anthracene and propyl vinyl ether, etc.

The maleimide compounds include maleimide, N-methyl maleimide, N-phenyl maleimide and N-cyclohexyl maleimide, etc.

The polymer compounds having the repeated structural unit selected from formulae (8) to (11) can be synthesized by for example adding the above-mentioned monomer compound and a polymerization initiator such as azobisisobutyronitrile or the like in a suitable organic solvent, and subjecting them to polymerization under heating.

As the polymer compound contained in the anti-reflective coating forming composition for lithography according to the present invention, polymer compounds having the repeated structural unit selected from formulae (15) to (17) in the proportion of 20 to 100%, or 30 to 90%, or 40 to 70%, or 50 to 60% based on the whole repeated structural units constituting the polymer can be also used. In the formula, $Ar_2$ is as defined above.

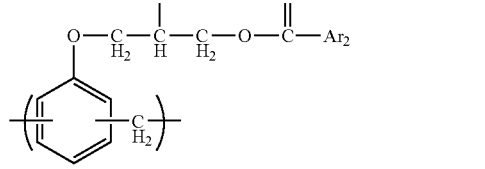

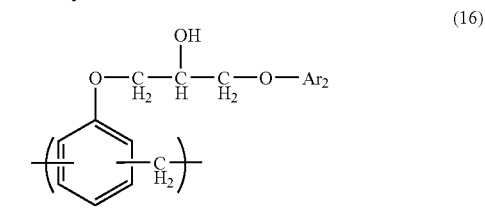

These polymer compounds can be synthesized from phenol novolak compounds. For example, they can be obtained by introducing glycidyl group into all or a part of hydroxy groups of the phenol novolak, and reacting all or a part of the epoxy rings of the glycidyl groups with a phenol compound ($Ar_2$—OH) or a carboxylic acid compound ($Ar_2$—COOH). They can be also synthesized for example with reference to U.S. Pat. No. 5,693,691.

As the polymer compound contained in the anti-reflective coating forming composition for lithography according to the present invention, polymer compounds having a nitrogen-containing ring structure selected from triazine trione ring, imidazolidine dione ring, 2,5-pyrrolidine dione ring and pyrimidine trione ring can be used.

The polymer compound having 2,5-pyrrolidine dione ring includes polymer compounds that can be synthesized by polymerization by use of a maleimide compound such as maleimide, N-methylmaleimide, N-ethylmaleimide, N-benzylmaleimide, N-phenylmaleimide and N-cyclohexylmaleimide, etc. as a monomer compound. They include for example polymaleimide, a copolymer of N-methylmaleimide with 2-hydroxyethyl methacrylate, a copolymer of N-cyclohexyl maleimide with acrylic acid, and a copolymer of maleimide with N-methyl maleimide and methyl methacrylate, etc.

The polymer compound having triazine trione ring, imidazolidine dione ring, or pyrimidine trione ring includes polymer compounds having the repeated structural unit of formula (1).

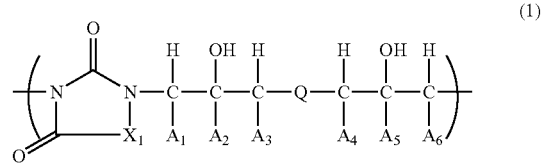

In formula (1), $A_1, A_2, A_3, A_4, A_5,$ and $A_6$ independently of one another are hydrogen atom, methyl or ethyl, $X_1$ is a group of formula (2), (3) or (4), and Q is a group of formula (5) or (6). In case where $X_1$ is the group of formula (2) in formula (1), the ring is imidazolidine dione ring, in case where $X_1$ is the group of formula (3), the ring is pyrimidine trione ring, and in case where $X_1$ is the group of formula (4), the ring is triazine trione ring.

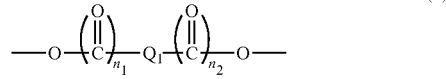

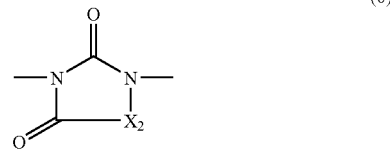

In formulae (2) and (3), $R_1$ and $R_2$ independently of each other are hydrogen atom, $C_{1-6}$alkyl, $C_{3-6}$alkenyl, benzyl or phenyl, and the phenyl may be substituted with a group selected from the group consisting of $C_{1-6}$alkyl, halogen atom, $C_{1-6}$alkoxy, nitro, cyano, hydroxy and $C_{1-6}$alkylthio. In addition, $R_1$ and $R_2$ may form $C_{3-6}$ring by linking each other.

In formula (4), $R_3$ is $C_{1-6}$alkyl, $C_{3-6}$alkenyl, benzyl or phenyl, and the phenyl may be substituted with a group selected from the group consisting of $C_{1-6}$alkyl, halogen atom, $C_{1-6}$alkoxy, nitro, cyano, hydroxy and $C_{1-6}$alkythio.

In formula (5), $Q_1$ is $C_{1-10}$alkylene, phenylene, naphthylene or anthrylene, and each of the phenylene, naphthylene and anthrylene may be substituted with a group selected from the group consisting of $C_{1-6}$alkyl, halogen atom, $C_{1-6}$alkoxy, nitro, cyano, hydroxy and $C_{1-6}$alkylthio, each of $n_1$ and $n_2$ is a number of 0 or 1.

In formula (6), $X_2$ is a structure of formula (2) or (3).

The $C_{1-6}$alkyl includes methyl, ethyl, isopropyl, cyclopentyl, n-hexyl and isobutyl, etc. The $C_{3-6}$alkenyl includes 1-propenyl, 2-propenyl, 2-butenyl, 3-butenyl, cyclopenten-3-yl and 4-pentenyl, etc. The $C_{1-6}$alkoxy includes methoxy, ethoxy, isopropoxy and cyclohexenyl, etc. The $C_{3-6}$ring formed by linking $R_1$ and $R_2$ each other is cyclobutane ring, cyclopentane ring and cyclohexane ring, etc. The $C_{1-10}$ alkylene includes methylene, ethylene, propylene, n-pentylene, cyclohexylene and 2-methylpropylene, etc. The $C_{1-6}$ alkylthio includes methylthio, ethylthio and isopropylthio, etc.

The polymer compound having the repeated structural unit of formula (1) can be synthesized by for example a reaction of the compound of formula (18) with the compound of formula (19). In addition, it can be synthesized by a reaction of the compound of formula (20) with the compound of formula (21).

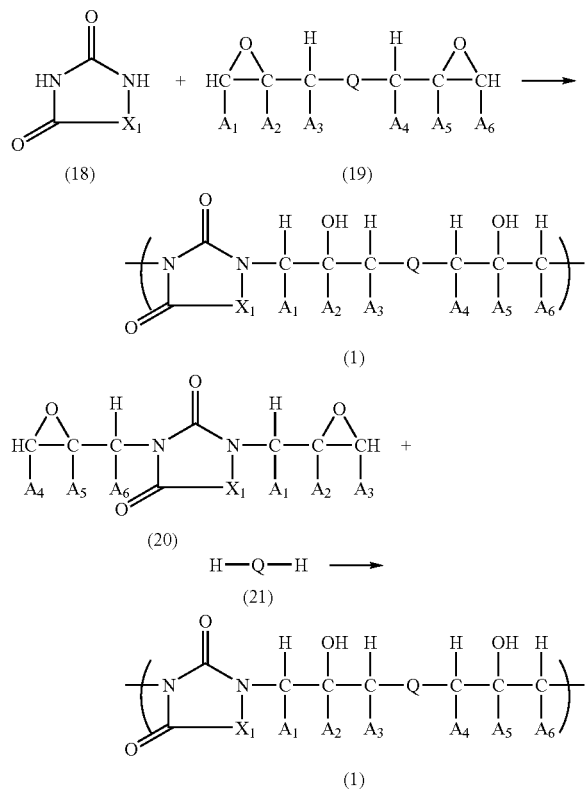

It is preferable to carry out the reaction between the compound of formula (18) and the compound of formula (19), and the reaction between the compound of formula (20) and the compound of formula (21), in a solution state dissolved in a suitable solvent such as benzene, toluene, xylene, ethyl lactate, butyl lactate, propylene glycol monomethyl ether, propylene glycol monomethyl ether acetate and N-methyl pyrrolidone, etc. In this reaction, the compounds of formulae (18), (19), (20) and (21) can be used singly or in a mixture of two or more compounds, respectively. In this reaction, quaternary ammonium salts such as benzyl triethyl ammonium chloride, tetrabutyl ammonlum chloride and tetraethylammonium bromide, etc. can be used as a catalyst. The reaction time and reaction temperature of this reaction are suitably selected from a reaction time ranging from 0.1 to 100 hours and a reaction temperature ranging from 20 to 200° C. Preferably, this reaction is carried out in a condition of a reaction time ranging from 1 to 30 hours and a reaction temperature ranging from 80 to 150° C. In addition, when the catalyst is used, it can be used in an amount of 0.01 to 20 mass % based on the whole mass of the used compounds.

In addition, the proportion of the compound of formula (18) and the compound of formula (19) used in the reaction is 3:1 to 1:3, or 3:2 to 2:3, or 1:1 in a molar ratio of the compound of formula (18): the compound of formula (19). The proportion of the compound of formula (20) and the compound of formula (21) used in the reaction is 3:1 to 1:3, or 3:2 to 2:3, or 1:1 in a molar ratio of the compound of formula (20): the compound of formula (21).

In the reaction between the compound of formula (18) and the compound of formula (19), two reaction moieties (N—H moieties) of the compound of formula (18) causes epoxy ring opening reaction with epoxy ring moieties of the compound of formula (19), respectively. As a result of it, the polymer compound having the repeated structural unit of formula (1) is produced. And, it is thought that the resulting polymer compound essentially comprises the repeated structural unit of formula (1) except the terminal moiety.

In the reaction between the compound of formula (20) and the compound of formula (21), two reaction moieties (epoxy ring moieties) of the compound of formula (20) causes epoxy ring opening reaction with the compound of formula (21), respectively. As a result of it, the polymer compound having the repeated structural unit of formula (1) is produced. And, it is thought that the resulting polymer compound essentially comprises the repeated structural unit of formula (1) except the terminal moiety.

The specific examples of the compound of formula (18) include for example hydantoin compounds such as hydantoin, 5,5-diphenylhydantoin, 5,5-dimethylhydantoin, 5-ethylhydantoin, 5-benzylhydantoin, 5-ethyl-5-phenylhydantoin, 5-methylhydantoin, 5,5-tetramethylenehydantoin, 5,5-pentamethylenehydantoin, 5-(4-hydroxybenzyl)-hydantoin, 5-phenylhydantoin, 5-hydroxymethylhydantoin, and 5-(2-cyanoethyl) hydantoin, etc.

The specific examples of the compound of formula (18) also include for example barbituric acid compounds such as 5,5-diethylbarbituric acid, 5,5-diallylmalonyl urea, 5-ethyl-5-isoamylbarbituric acid, 5-allyl-5-isobutylbarbituric acid, 5-allyl-5-isopropylbarbituric acid, 5-β-bromoallyl-5-sec-butylbarbituric acid, 5-ethyl-5-(1-methyl-1-butenyl) barbituric acid, 5-isopropyl-5-β-bromoallyl barbituric acid, 5-(1-cyclohexyl)-5-ethylmalonyl urea, 5-ethyl-5-(1-methylbutyl) malonylurea, 5,5-dibromobarbituric acid, 5-phenyl-5-ethylbarbituric acid, and 5-ethyl-5-n-butylbarbituric acid, etc.

In addition, the specific examples of the compound of formula (18) include for example isocyanuric acid compounds such as monoallyl isocyanuric acid, monomethylisocyanuric acid, monopropylisocyanuric acid, monoisopropylisocyanuric acid, monophenylisocyanuric acid, monobenzylisocyanuric acid, and monoethylisocyanuric acid, etc.

The specific examples of the compound of formula (19) include for example diglycidyl compounds such as diglycidyl terephthalate, diglycidyl isophthalate, diglycidyl phthalate, diglycidyl 2,5-dimethylterephthalate, diglycidyl 2,5-diethylterephthalate, diglycidyl 2,3,5,6-tetrachloroterephthalate, diglycidyl 2,3,5,6-tetrabromoterephthalate, diglycidyl 2-nitroterephthalate, diglycidyl 2,3,5,6-tetrafluoroterephthalate, diglycidyl 2,5-dihydroxyterephthalate, diglycidyl 2,6-dimethylterephathalate, diglycidyl 2,5-dichloroterephthalate, diglycidyl 2,3-dichloroisophthalate, diglycidyl 3-nitroisophthalate, diglycidyl 2-bromoisophthalate, diglycidyl 2-hydroxyisophthalte, diglycidyl 3-hydroxyisophthalate, diglycidyl 2-methoxyisophthalte, diglycidyl 5-phenylisophthalate, diglycidyl 3-nitrophthalte, diglycidyl 3,4,5,6-tetrachlorophthalate, diglycidyl 4,5-dichlorophthalate, diglycidyl 4-hydroxyphthalate, diglycidyl 4-nitrophthalate, diglycidyl 4-methylphthalate, diglycidyl 3,4,5,6-tetrafluorophthalate, diglycidyl 2,6-naphthalene dicarboxylate, diglycidyl 1,2-naphthalene dicarboxylate, diglycidyl 1,4-naphthalene dicarboxylate, diglycidyl 1,8-naphthalene dicarboxylate, diglycidyl anthracene-9,10-dicarboxylate, and ethylene glycol diglycidyl ether, etc.

The specific examples of the compound of formula (19) also include for example diglycidylhydantoin compounds such as 1,3-diglycidylhydantoin, 1,3-diglycidyl-5,5-diphenylhydantoin, 1,3-diglycidyl-5,5-dimethylhydantoin, 1,3-diglycidyl-5-methylhydantoin, 1,3-diglycidyl-5-ethyl-5-phenylhydantoin, 1,3-diglycidyl-5-benzylhydantoin, 1,3-diglycidyl-5-hydantoin acetic acid, 1,3-diglycidyl-5-ethyl-5-methylhydantoin, 1,3-diglycidyl-5-ethylhydantoin, 1,3-diglycidyl-5,5-tetramethylene hydantoin, 1,3-diglycidyl-5,5-pentamethylene hydantoin, 1,3-diglycidyl-5-(4-hydroxybenzyl) hydantoin, 1,3-diglycidyl-5-phenylhydantoin, 1,3-diglycidyl-5-hydroxymethylhydantoin, and 1,3-diglycidyl-5-(2-cyanoethyl) hydantoin, etc.

In addition, the specific examples of the compound of formula (19) include for example diglycidylbarbituric acid compounds such as 1,3-diglycidyl-5,5-diethylbarbituric acid, 1,3-diglycidyl-5-phenyl-5-ethylbarbituric acid, 1,3-diglycidyl-5-ethyl-5-isoamylbarbituric acid, 1,3-diglycidyl-5-allyl-5-isobutylbarbituric acid, 1,3-diglycidyl-5-allyl-5-isopropylbarbituric acid, 1,3-diglycidyl-5-β-bromoallyl-5-sec-butylbarbituric acid, 1,3-diglycidyl-5-ethyl-5-(1-methyl-1-butenyl) barbituric acid, 1,3-diglycidyl-5-isopropyl-5-β-bromoallylbarbituric acid, 1,3-diglycidyl-5-(1-cyclohexyl)-5-ethylmalonyl urea, 1,3-diglycidyl-5-ethyl-5-(1-methylbutyl) malonyl urea, 1,3-diglycidyl-5,5-diallylmalonyl urea diglycidyl, and 1,3-diglycidyl-5-ethyl-n-butylbarbituric acid, etc.

In the synthesis of the polymer compound, each of the compounds of formulae (18) and (19) can be used singly or in a mixture of two or more compounds.

Further, for example when monoallyl isocyanuric acid is used as the compound of formula (18) and diglycidyl terephthalate is used as the compound of formula (19), it is thought that a polymer compound essentially comprising the repeated structural unit of formula (22) is produced. In addition, for example when 5,5-diethylbarbituric acid is used as the compound of formula (18) and two kinds compounds, that is, diglycidyl terephthalate and ethylene glycol diglycidyl ether are used as the compound of formula (19), it is thought that a polymer compound essentially comprising the repeated structural units of formulae (23) and (24) is produced.

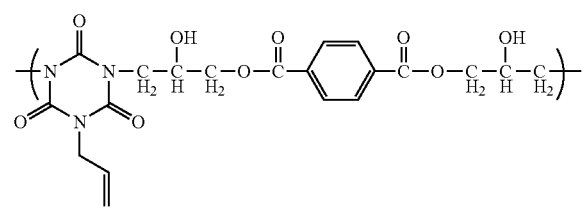

(22)

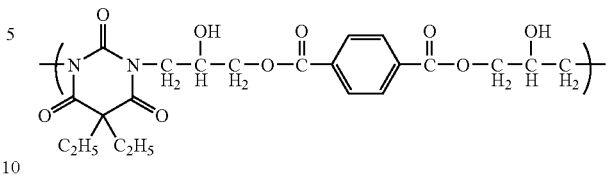

(23)

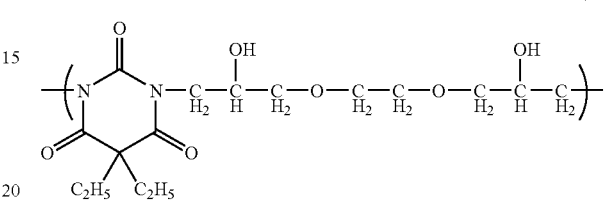

(24)

The specific examples of the compound of formula (20) include the diglycidylhydantoin compounds and diglycidyl barbituric acid compounds mentioned as the specific examples of those of formula (19). In addition, it includes diglycidyl isocyanuric acid compounds such as monoallyldiglycidyl isocyanuric acid, monoethyldiglycidyl isocyanuric acid, monopropyldiglycidyl isocyanuric acid, monoisopropyldiglycidyl isocyanuric acid, monophenyldiglycidyl isocyanuric acid, monobromodiglycidylisocyanuric acid and monomethyldiglycidyl isocyanuric acid, etc.

The specific examples of the compound of formula (21) include the hydantoin compounds and barbituric acid compounds mentioned as the specific examples of those of formula (18). Further, it also includes compounds such as terephthalic acid, isophthalic acid, phthalic acid, 2,5-dimethylterephthalic acid, 2,5-diethylterephthalic acid, 2,3,5,6-tetrachloroterephthalic acid, 2,3,5,6-tetrabromoterephthalic acid, 2-nitroterephthalic acid, 2,3,5,6-tetrafluoroterephthalic acid, 2,5-dihydroxyterephthalic acid, 2,6-dimethylterephthalic acid, 2,5-dichloroterephthalic acid, 2,3-dichloroisophthalic acid, 3-nitroisophthalic acid, 2-bromoisophthalic acid, 2-hydroxyisophthalic acid, 3-hydroxylsophthalic acid, 2-methoxyisophthalic acid, 5-phenylisophthalic acid, 3-nitrophthalic acid, 3,4,5,6-tetrachlorophthalic acid, 4,5-dichlorophthalic acid, 4-hydroxyphthalic acid, 4-nitrophthalic acid, 4-methylphthalic acid, 3,4,5,6-tetrafluorophthalic acid, 2,6-naphthalene dicarboxylic acid, 1,2-naphthalene dicarboxylic acid, 1,4-naphthalene dicarboxylic acid, 1,8-naphthalene dicarboxylic acid, anthracene-9,10-dicarboxylic acid, ethylene glycol, 1,3-propane dicarboxylic acid, and 4-hydroxy benzoic acid, etc.

In the synthesis of the polymer compound, each of the compounds of formulae (20) and (21) can be used singly or in a mixture of two or more compounds. Further, for example when monoallyl diglycidyl isocyanuric acid is used as the compound of formula (20) and 5,5-diethylbarbituric acid is used as the compound of formula (21), it is thought that a polymer compound essentially comprising the repeated structural unit of formula (25) is produced.

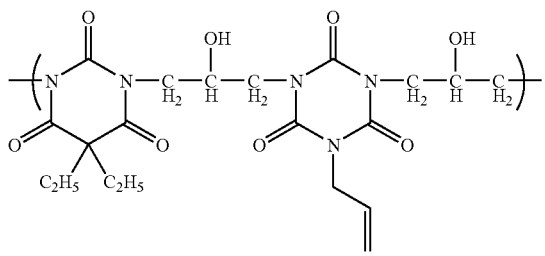

(25)

As the polymer compound contained in the anti-reflective coating forming composition for lithography according to the present invention, other polymer compounds such as polyester, polystyrene, polyimide, acrylic polymer, methacrylic polymer, polyvinyl ether, phenol novolak, naphthol novolak, polyether, polyamide, and polycarbonate, etc. can be used.

The polymer compound contained in the anti-reflective coating forming composition for lithography according to the present invention has a weight average molecular weight (in terms of standard polystyrene) of for example 800 to 300000, or 1000 to 100000, or 2000 to 50000, or 3000 to 10000, or 4000 to 8000.

The proportion of the polymer compound in the solid content of the anti-reflective coating forming composition for lithography according to the present invention is for example 50 to 98 mass %, or 55 to 90 mass %, or 65 to 80 mass %.

The anti-reflective coating forming composition for lithography according to the present invention comprises a crosslinking compound. The use of the crosslinking compound causes crosslinking reaction on baking for forming the anti-reflective coating and leads to the formation of the anti-reflective coating having crosslinked structure. Consequently, the anti-reflective coating becomes tough, and becomes a coating having a low solubility in an organic solvent used for the photoresist solution applied thereon. These crosslinking compounds can occur crosslinking reaction due to self-condensation. In addition, the polymer compound contained in the anti-reflective coating forming composition according to the present invention has hydroxy group and carboxy group, etc., the crosslinking compound can occur crosslinking reaction with these groups.

As the crosslinking compound, a compound having two or more, for example two to six crosslinkable groups such as isocyanate group, epoxy group, hydroxymethylamino group, and alkoxymethylamino group, etc. can be used.

As the crosslinking compound, a nitrogen-containing compound having a nitrogen atom substituted with hydroxymethyl group or alkoxymethyl group can be used. Specifically, it includes nitrogen-containing compounds such as hexamethoxy methylmelamine, tetramethoxymethyl benzoguanamine, 1,3,4,6-tetrakis(methoxymethyl) glycoluril, 1,3,4,6-tetrakis(butoxymethyl) glycoluril, 1,3,4,6-tetrakis(hydroxymethyl) glycoluril, 1,3-bis(hydroxymethyl) urea, 1,1,3,3-tetrakis(butoxymethyl) urea, 1,1,3,3-tetrakis(methoxymethyl) urea, 1,3-bis(hydroxymethyl)-4,5-dihydroxy-2-imidazolinone, and 1,3-bis(methoxymethyl)-4,5-dimethoxy-2-imidazolinone, etc. Further, it includes commercially available nitrogen-containing compounds such as methoxymethyl type melamine compounds manufactured by Nihon Cytec Industries, Inc. (former Mitsui Cytec Co., Ltd.) (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), etc., methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (trade name: Beckamine J-300S, Beckamine P-955, Beckamine N), and the like.

As the crosslinking compound, the polymers produced by use of acrylamide compounds or methacrylamide compounds substituted with hydroxymethyl group or alkoxymethyl group such as N-hydroxymethyl acrylamide, N-methoxymethyl methacrylamide, N-ethoxymethyl acrylamide, and N-butoxymethyl methacrylamide, etc. can be used. Such polymers include for example poly(N-butoxymethylacrylamide), a copolymer of N-butoxymethylacrylamide with styrene, a copolymer of N-hydroxymethylmethacrylamide with methylmethacrylate, a copolymer of N-ethoxymethylmethacrylamide with benzylmethacrylate, and a copolymer of N-butoxymethylacrylamide, benzylmethacrylate and 2-hydroxypropylmethacrylate, etc.

The crosslinking compound can be used singly or a combination of two or more compounds.

The proportion of the crosslinking compound in the solid content of the anti-reflective coating forming composition for lithography according to the present invention is for example 1 to 49 mass %, or 8 to 40 mass %, or 15 to 30 mass %.

The anti-reflective coating forming composition for lithography according to the present invention comprises a crosslinking catalyst. The use of the crosslinking catalyst accelerates crosslinking reaction.

The crosslinking catalyst includes sulfonic acid compounds such as p-toluene sulfonic acid, trifluoromethane sulfonic acid, pyridinium-p-toluene sulfonic acid, salicylic acid, camphor sulfonic acid, sulfosalicylic acid, 4-chlorobenzenesulfonic acid, 4-hydroxybenzene sulfonic acid, benzenedisulfonic acid, 1-naphtthalene sulfonic add, and pyridinium-1-naphthalene sulfonic acid, etc. In addition, as the crosslinking catalyst, carboxylic acid compounds such as citric acid, benzoic acid, and hydroxybenzoic acid, etc. can be used.

The crosslinking catalyst can be used singly or a combination of two or more. The proportion of the crosslinking catalyst in the solid content of the anti-reflective coating forming composition for lithography according to the present invention is for example 0.01 to 10 mass %, or 0.1 to 8 mass %, or 0.5 to 5 mass %.

The anti-reflective coating forming composition for lithography according to the present invention comprises a sulfonate compound. The use of the sulfonate compound makes possible to easily form rectangle photoresist pattern.

The used sulfonate compound is not specifically limited. For example, it includes alkylsulfonate compounds having $C_{1-10}$alkyl. The $C_{1-10}$alkyl may be substituted with a group selected from phenyl, naphthyl, alkoxy and halogen, etc. In addition, it may be aromatic sulfonate compounds having aromatic hydrocarbon ring such as benzene ring, naphthalene ring, anthracene ring, fluorene ring and naphthacene ring, etc., or those having aromatic hetero ring such as pyridine ring, furan ring, quinoline ring, thiophene ring, pyrimidine ring, quinoxaline ring, and thiadiazole ring, etc. The ester moiety of the sulfonate compound may be either alkyl ester or aryl ester.

The sulfonate compound contained in the anti-reflective coating forming composition for lithography according to the present invention can be obtained according to the known method. For example, sulfonate compounds can be obtained by a reaction of a sulfonyl chloride compound with an alcohol compound or a phenol compound in the presence of a base. As the sulfonyl chloride compound, alkylsulfonyl chloride compounds and aromatic sulfonyl chloride compounds can be used.

The alkylsulfonyl chloride compounds are not specifically limited, and include for example alkylsulfonyl chloride compounds having $C_{1-10}$alkyl that may be substituted with a group selected from phenyl, naphthyl, alkoxy and halogen, etc. The specific examples of the alkylsulfonyl chloride compounds are for example methane sulfonyl chloride, trifluoromethane sulfonyl chloride, ethane sulfonyl chloride, benzyl sulfonyl chloride, isopropyl sulfonyl chloride, camphor-10-sulfonyl chloride, 1-octane sulfonyl chloride, and 1H,1H-perfluoro octane sulfonyl chloride, etc.

In addition, the aromatic sulfonyl chloride compounds are not specifically limited, and include for example benzene sulfonyl chloride compounds such as benzene sulfonyl chloride, 4-toluene sulfonyl chloride, 2-nitrobenzene sulfonyl chloride, 2,5-dichlorobenzene sulfonyl chloride, 1,3-benzenedisulfonyl chloride, 4-(2-phthalimide) phenylsulfonylchloride, 2,4,6-trimethylbenzene sulfonyl chloride, 1,3,5-benzenetrisulfonyl chloride, 2,3,5,6-tetramethylbenzene sulfonyl chloride, 4-(trifluoromethyl) benzene sulfonyl chloride, pentamethyl benzene sulfonyl chloride, 4-n-propyl benzene sulfonyl chloride, 4-ethylbenzene sulfonyl chloride, 4-n-butyl benzene sulfonyl chloride, 4-biphenyl sulfonyl chloride, 4-tert-butylbenzene sulfonyl chloride, 4-styrene sulfonyl chloride, 4,4'-methylenebis(benzene sulfonyl chloride), 4,4'-biphenyldisulfonyl chloride, and 4,4'-bis(chlorosulfonyl) diphenyl ether, etc., naphthalene sulfonyl chloride compounds such as naphthalene-1-sulfonyl chloride, naphthalene-2-sulfonyl chloride, 2,6-naphthalene disulfonyl chloride, and 1,5-naphthalene disulfonyl chloride, etc., and further anthracene sulfonyl chloride compounds such as 2-anthracene sulfonyl chloride and 9-anthracene sulfonyl chloride, etc., and fluorene sulfonyl chloride compounds such as fluorene-2,7-disulfonyl chloride, etc. In addition, the compounds include sulfonyl chloride compounds having aromatic hetero ring, such as thiphene-2-sulfonyl chloride, 8-quinoline sulfonyl chloride, 5-quinoline sulfonyl chloride, 2-dibenzofuran sulfonyl chloride, benzo-2,1,3-triazole-4-sulfonyl chloride, benzofuran-4-sulfonylchloride and 5-isoquinoline sulfonyl chloride, etc.

Further, the alcohol compounds and the phenol compounds are not specifically limited. The alcohol compounds and phenol compounds that can react with an alkyl sulfonyl chloride compound or an aromatic sulfonyl chloride compound to give an alkyl sulfonate compound or an aromatic sulfonate compound can be used.

The alcohol compounds include for example aliphatic alcohol compounds such as methanol, ethanol, n-pentanol, cyclohexanol, cyclooctanol, decalin-2-ol, 2-ethyl-1-hexanol, 2-ethyl-1,3-hexanediol, 1,2-cyclohexanediol, 2,2,2-trifluoroethanol, 1H,1H-perfluoro-1-octanol, 1,2-cyclohexanedimethanol, and 2-tridecanol, etc. The compounds also include alcohol compounds having aromatic hydrocarbon ring or aromatic hetero ring, such as benzyl alcohol, 9-hydroxymethyl anthracene, phenylethyl alcohol, 1,2-benzenedimethanol, 2-hydroxymethyl thiophene and 2-naphthalene methanol, etc.

The phenol compounds include for example phenol, cresol, 2-naphthol, and hydroxy anthracene, etc.

As the sulfonate compound in the anti-reflective coating forming composition for lithography according to the present invention, the aromatic sulfonate compounds having the structure of formula (7) can be used. In formula (7), $Ar_1$ is a benzene ring, a naphthalene ring or an anthracene ring that may be substituted with a group selected from the group consisting of $C_{1-6}$alkyl, $C_{1-6}$alkoxy, hydroxy, nitro, cyano, amino, halogen, carboxy and $C_{1-6}$alkoxycarbonyl, $R_4$ and $R_5$ independently of each other are hydrogen atom or $C_{1-6}$alkyl, or $R_4$ and $R_5$ may form $C_{3-8}$ring by linking each other. The alkyl is methyl ethyl, isopropyl, n-hexyl, and cyclopentyl, etc. The alkoxy is methoxy, ethoxy, isopropyloxy, n-hexyloxy, and cyclopentyloxy, etc. The alkoxycarbonyl is methoxycarbonyl, ethoxycarbonyl, isopropylcarbonyl, and cyclopentyloxycarbonyl, etc. The $C_{3-8}$ring formed by $R_4$ and $R_5$ is cyclopropyl ring, cyclobutyl ring, and cylcohexyl ring, etc.

The aromatic sulfonate compounds having the structure of formula (7) can be obtained for example by reaction of the compound having the structure of formula (26) with the compound of formula (27). The compound having the structure of formula (26) is an alcohol compound, several alcohol compounds can be used.

(26)

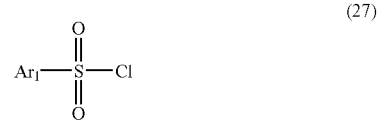

(27)

As the sulfonate compound in the anti-reflective coating forming composition according to the present invention, the aromatic sulfonate compounds having two to four of or two to three of the structure of formula (7) can be used. The compounds can be obtained by reaction of the alcohol compound having two to four of the structure of formula (26) with the compound of formula (27).

The alcohol compound having two to four of the structure of formula (26) includes for example ethylene glycol, 1,2-propylene glycol, 1,3-propylene glycol, 1,2,3-propanetriol, diethylene glycol, triethylene glycol, pentaerythritol, 1,3-benzene dimethanol, 1,4-benzene dimethanol, 1,2-cyclohexanediol, 1,4-cyclohexanediol, 1,3-cyclopentanediol, 1,2-dicyclohexyl-1,2-ethanediol, 1,2-diphenyl-1,2-ethanediol, 3,4-furandiol, 1,4-dioxane-2,3-diol, 1,4-dioxane-2,5-diol, and trimethylol propane, etc.

The compound of formula (27) includes the above-mentioned benzene sulfonyl chloride compounds, naphthalene sulfonyl chloride compounds and anthracene sulfonyl chloride compounds.

When the aromatic sulfonate compounds having two to four of the structure of formula (7) are synthesized by reaction of the alcohol compound having two to four of the structure of formula (26) with the compound of formula (27), the compound of formula (27) can be used singly or in a mixture of two or more.

The specific examples of the aromatic sulfonate compounds used in the anti-reflective coating forming composition according to the present invention are for example toluene sulfonate compounds such as 1,3-bis(p-toluenesulfonyloxy) propane, 1,2-bis(p-toluenesulfonyloxy) ethane, 1,4-di-o-tosyl-2,3-o-isopropylidene threitol, triethylene glycol ditosylate, 2,3-dihydroxybutane-1,4-diyl-bis(p-toluenesulfonate), tetra(p-toluenesulfonyloxymethyl) methane, 1,2-propanedioldi-p-tosylate, 1,2,4-tritosylbutane triol, 2,3-butanedioldi-p-tosylate, diethylene glycoldi-p-tosylate, N,N-bis(2-(tosyloxy)ethyl)toluene-4-sulfonamide and 1,3-adamantanedimethanol-di-p-tosylate, 1-benzyloxy- 3-(p-tosyloxy)-2-propanol, 4,4'-bis(p-toluenesulfonyloxy) isopropylidene cyclohexane, 1,3-bis(p-toluenesulfonyloxy) cyclohexane, 1,4-bis(p-toluenesulfonyloxy)cyolohexane, etc.

In addition, the specific examples of the alkyl sulfonate compounds used in the anti-reflective coating forming composition according to the present invention are for example 1,4-bis(mesyloxy)cyclohexane, 1,4-bis(2,2,2-trifluoroethanesulfonyloxy) cyclohexane, 1,4-bis(trifluoromethanesulfonyloxy) cyclohexane, 1,3-bis(mesyloxy) cyclohexane, 1,3-bis(2,2,2-trifluoroethanesulfonyloxy) cyclohexane, 1,3-bis(trifluoromethanesulfonyloxy) cyclohexane, 1,3-bis(2,2,2-trifluoroethanesulfonyloxy) propane, etc.

When an anti-reflective coating is formed from the anti-reflective coating forming composition for lithography according to the present invention, a baking step is carried out as mentioned below. Therefore, it is preferable that the sulfonate compound used in the anti-reflective coating forming composition for lithography according to the present invention is a compound that is not easily decomposed by heat. As the sulfonate compound used in the anti-reflective coating forming composition according to the present invention, sulfonate compounds having a thermolysis temperature of for example 150° C. or more, or 170° C. or more, or 200° C. or more, or 220° C. or more, or 250° C. or more are preferably used. In this specification, the thermolysis temperature is a 10% weight loss temperature obtained by thermogravimetry, that is, a temperature when 10% weight loss of a sulfonate compound is observed. From the viewpoint of thermolysis temperature, aromatic sulfonate compounds are preferably used.

In the anti-reflective coating forming composition for lithography according to the present invention, the sulfonate compound can be used singly or a combination of two or more. The proportion of the sulfonate compound in the solid content of the anti-reflective coating forming composition for lithography according to the present invention is for example 0.01 to 20 mass %, or 0.1 to 15 mass %, or 0.5 to 10 mass %.

The anti-reflective coating forming composition for lithography according to the present invention can contain a photoacid generator. The photoacid generator can adjust the acidity of the anti-reflective coating as it generates an add on the exposure of photoresists. This is used as a measure for conforming the acidity of the anti-reflective coating to that of the photoresist applied thereon. In addition, the adjustment of the acidity of the anti-reflective coating makes possible to adjust the pattern shape of the photoresist formed thereon.

The photoacid generator includes onium salt compounds, sulfoneimide compounds, and disulfonyl diazomethane compounds, etc.

The onium salt compounds include iodonium salt compounds such as diphenyl iodonium hexafluoro phosphate, diphenyl iodonium trifluoromethane sulfonate, diphenyl iodonium nonafluoro-n-butane sulfonate, diphenyl iodonium perfluoro-n-octane sulfonate, diphenyl iodonium camphor sulfonate, bis(4-tert-butylphenyl) iodonium camphor sulfonate and bis(4-tert-butylphenyl) iodonium trifluoro methane sulfonate, etc., sulfonium salt compounds such as triphenyl sulfonium hexafluoro antimonate, triphenylsulfonium nonafluoro-n-butane sulfonate, triphenyl sulfonium camphor sulfonate and triphenyl sulfonium trifluoro methane sulfonate, etc.

The sulfoneimide compounds include for example N-(trifluoromethanesulfonyloxy) succinimide, N-(nonafluoro-n-butanesulfonyloxy) succinimide, N-(camphorsulfonyloxy) succinimide and N-(trifluoromethanesulfonyloxy) naphthalimide, etc.

The disulfonyl diazomethane compounds include for example bis(trifluoromethylsulfonyl) diazomethane, bis(cyclohexylsulfonyl) diazomethane, bis(phenylsulfonyl) diazomethane, bis(p-toluenesulfonyl) diazomethane, bis(2,4-dimethylbenzenesulfonyl) diazomethane, and methylsulfonyl-p-toluenesulfonyl diazomethane, etc.

The photoacid generator can be used singly or in a combination of two or more. When the photoacid generator is contained in the anti-reflective coating forming composition for lithography according to the present invention, the contained amount thereof is for example 0.01 to 5 mass %, or 0.1 to 3 mass %, or 0.5 to 2 mass % in the solid content.

The anti-reflective coating forming composition for lithography according to the present invention can contain surfactants, rheology controlling agents and adhesive auxiliary agents, etc., if desired. The surfactants are effective for inhibiting occurrence of pinholes or striation, etc. The rheology controlling agents are effective for improving the fluidity of the anti-reflective coating forming composition, particularly for improving the filling property of the anti-reflective coating forming composition inside holes in the baking step. The adhesive auxiliary agents are effective for improving the adhesiveness between the semiconductor substrate or photoresist and the anti-reflective coating, particularly for preventing separation of the photoresist in development.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc, polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Jemco Inc.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be used singly or in combination of two or more. When the surfactant is contained in the anti-reflective coating forming composition according to the present invention, the contained amount is 0.0001 to 5 mass % or 0.001 to 2 mass % in the solid content.

The solvent used in the anti-reflective coating forming composition for lithography according to the present invention is any solvent that can dissolve the solid content. Such solvents include for example methyl cellosolve acetate, ethyl cellosolve acetate, propylene glycol, propylene glycol monomethyl ether, propylene glycol monobutyl ether, propylene glycol monomethyl acetate, propylene glycol monoethyll ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, ethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxy acetate, ethyl 2-hydroxy-2-ethylpropionate, methyl 3-methoxy-2-methylpropionate, methyl 2-hydroxy-3-methylbutyrate, ethyl methoxy acetate, methyl ethoxy acetate, propyl 3-methoxypropionate, propyl 3-ethoxypropionate, ethyl 3-propoxypropionate, 3-methoxybutyl acetate, 3-methoxypropylacetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone and γ-butyrolactone, etc. These solvents are used singly or in combination of two or more.

The prepared solution of the anti-reflective coating resin composition according to the present invention can be used after filtering through a filter having a pore diameter ranging from about 0.20 μm to 0.05 μm. The anti-reflective coating resin composition for lithography prepared as mentioned above is also excellent in long-term shelf stability at room temperature.

Hereinafter, the utilization of the anti-reflective coating forming composition for lithography according to the present invention is described.

The anti-reflective coating forming composition of the present invention is applied on a semiconductor substrate (for example, silicon wafer substrate, silicon/silicon dioxide coat substrate, silicon nitride substrate, and ITO substrate, etc.) by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably the baking temperature is 150 to 250° C. and the baking time is 0.5 to 5 minutes. The thickness of the anti-reflective coating is for example 0.01 to 3.0 μm, or preferably for example 0.03 to 1.0 μm, or 0.05 to 0.5 μm, or 0.05 to 0.2 μm.

Then, a photoresist layer is formed on the anti-reflective coating. The formation of the photoresist layer can be conducted by well-known process, that is, by application of a photoresist composition solution on the anti-reflective coating and baking.

The photoresist to be coated and formed on the anti-reflective coating of the present invention is not specifically limited so long as it is sensitive to the light used in exposure, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern.

The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. As the developer, 2.38 mass % tetramethyl ammonium hydroxide aqueous solution that is widely used can be used. Further, surfactants can be added in these developers. The condition of development is suitably selected from a temperature of 5 to 50° C. and a time of 0.1 to 5 minutes.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane, perfluorocyclobutane, perfluoropropane, trifluoromethane, carbon monoxide, argon, oxygen, nitrogen, sulfur hexafluoride, difluoromethane, nitrogen trifluoride and chlorine trifluoride, etc.

Before forming the anti-reflective coating from the anti-reflective coating forming composition for lithography according to the present invention on a semiconductor substrate, a flattening coating or a gap-fill material layer may be formed. In case where semiconductor substrates having large steps or holes are used, it is preferable that the flattening coating or the gap-fill material layer is formed.

The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating from the anti-reflective coating forming composition for lithography according to the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition of the present invention can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

After 100 g of monoallyl digtycidyl isocyanuric acid (manufactured by Shikoku Chemicals Corporation), 66.4 g of 5,5-diethyl barbituric acid and 4.1 g of benzyltriethyl ammonium chloride were dissolved in 682 g of propylene glycol monomethyl ether, the solution was subjected to reaction at 130° C. for 24 hours to obtain a solution containing a polymer compound. GPC analysis showed that weight average molecular weight of the obtained polymer compound was 6800 in terms of standard polystyrene. In the meanwhile, it is assumed that the obtained polymer compound is basically composed of the repeated structural unit of formula (25).

Synthetic Example 2

After 7.0 g of diglycidyl terephthalate, 5.8 g of 5-phenyl-5-ethyl barbituric acid and 0.3 g of benzyltriethyl ammonium chloride were dissolved in 52.2 g of propylene glycol monomethyl ether, the solution was subjected to reaction at 130° C. for 24 hours to obtain a solution containing a polymer compound. GPC analysis showed that weight average molecular weight of the obtained polymer compound was 12700 in terms of standard polystyrene. In the meanwhile, it is assumed that the obtained polymer compound is basically composed of the repeated structural unit of formula (28).

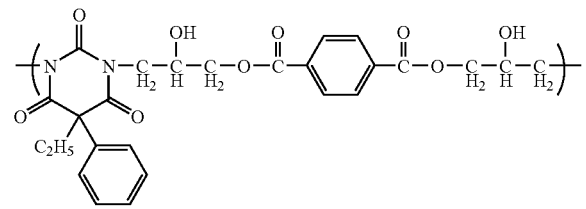

(28)

Example 1

In 10 g of the solution obtained in Synthetic Example 1, 35.4 g of propylene glycol monomethyl ether, 18.6 g of propylene glycol monomethyl ether acetate, 0.5 g of 1,3,4,6-tetrakis(methoxymethyl) glycoluril (manufactured by Nihon Cytec Industries, Inc. (former Mitsui Cytec Co., Ltd.) trade name: Powderlink 1174), 0.1 g of 1,3-bis(p-toluenesulfonyloxy) propane and 0.025 g of pyridinium-p-toluene sulfonic acid were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution for lithography.

Example 2

In 10 g of the solution obtained in Synthetic Example 2, 35.4 g of propylene glycol monomethyl ether, 18.6 g of propylene glycol monomethyl ether acetate, 0.5 g of 1,3,4,6-tetrakis(methoxymethyl) glycoluril (manufactured by Nihon Cytec Industries, Inc. (former Mitsui Cytec Co., Ltd.) trade name: Powderlink 1174), 0.1 g of 1,3-bis(p-toluenesulfonyloxy) propane and 0.025 g of pyridinium-p-toluene sulfonic acid were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution for lithography.

Examples 3 to 8

The procedures in Example 1 were repeated except that the compounds described below were used instead of 1,3-bis(p-toluenesulfonyloxy) propane as a sulfonate compound to prepare anti-reflective coating forming composition solutions for lithography from the solution obtained in Synthetic Example 1.
Example 3: 4,4'-bis(p-toluenesulfonyloxy) isopropylidene cyclohexane;
Example 4: 1,4-di-o-tosyl-2,3-o-isopropylidene threitol:
Example 5: 1,3-bis(p-toluenesulfonyloxy)cyclohexane;
Example 6: 1,4-bis(p-toluenesulfonyloxy)cyclohexane;
Example 7: 1,4-bis(mesyloxy)cyclohexane; and
Example 8: 1-benzyloxy-3-(p-tosyloxy)-2-propanol.

Comparative Example 1

In 23.3 g of the solution obtained in Synthetic Example 1, 9.6 g of propylene glycol monomethyl ether, 65.8 g of ethyl lactate, 1.2 g of 1,3,4,6-tetrakis(methoxymethyl) glycoluril (manufactured by Nihon Cytec Industries, Inc. (former Mitsui Cytec Co., Ltd.) trade name: Powderlink 1174), and 0.06 g of pyridinium-p-toluene sulfonic acid were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution.

Comparative Example 2

In 10 g of the solution obtained in Synthetic Example 1, 35.4 g of propylene glycol monomethyl ether, 18.6 g of propylene glycol monomethyl ether acetate, 0.5 g of 1,3,4,6-tetrakis(methoxymethyl) glycoluril (manufactured by Nihon Cytec Industries, Inc. (former Mitsui Cytec Co., Ltd.) trade name, Powderlink 1174), and 0.1 g of 1,3-bis(p-toluenesulfonyloxy) propane were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution.

Comparative Example 3

In 23.3 g of the solution obtained in Synthetic Example 2, 9.6 g of propylene glycol monomethyl ether, 65.8 g of ethyl lactate, 1.2 g of 1,3,4,6-tetrakis(methoxymethyl) glycoluril (manufactured by Nihon Cytec Industries, Inc. (former Mitsui Cytec Co., Ltd.) trade name: Powderlink 1174), and 0.06 g of pyridinium-p-toluene sulfonic acid were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution.

Comparative Example 4

In 10 g of the solution obtained in Synthetic Example 2, 35.4 g of propylene glycol monomethyl ether, 18.6 g of propylene glycol monomethyl ether acetate, 0.5 g of 1,3,4,6-tetrakis(methoxymethyl) glycoluril (manufactured by Nihon Cytec Industries, Inc. (former Mitsui Cytec Co., Ltd.) trade name: Powderlink 1174), and 0.1 g of 1,3-bis(p-toluenesulfonyloxy) propane were added to obtain a solution. Then, the resulting solution was filtered through a filter made of polyethylene having a pore diameter of 0.10 μm and further a filter made of polyethylene having a pore diameter of 0.05 μm to prepare an anti-reflective coating forming composition solution.

Thermogravimetric Analysis of Sulfonate Compound

10% Weight loss temperature of a sulfonate compound was determined by measuring thermogravity loss behavior (temperature rising rate 10° C./min., measurement range: 25 to 400° C.) under flow of air (flow rate 300 ml/min.) with differential thermogravity simultaneous measurement equipment TG/DTA320 (manufactured by Seiko Instruments Inc.).

10% weight loss temperature of each sulfonate compound was as follows:
1,3-bis(p-toluenesulfonyloxy) propane: 280° C.;
4,4'-bis(p-toluenesulfonyloxy) isopropylidene cyclohexane: 170° C.;
1,4-di-o-tosyl-2,3-o-isopropylidene threitol: 260° C.;
1,3-bis(p-toluenesulfonyloxy)cyclohexane: 190° C.;
1,4-bis(p-toluenesulfonyloxy)cyclohexane: 190° C.;
1,4-bis(mesyloxy)cyclohexane: 180° C.; and
1-benzyloxy-3-(p-tosyloxy)-2-propanol: 210° C.

Dissolution Test in Photoresist Solvent

The anti-reflective coating forming composition solutions obtained in Examples 1 to 8 and Comparative Examples 1 to 4 were coated on silicon wafer substrate substrates by means of a spinner, respectively. The coated silicon wafer substrates were baked at 205° C. for 1 minute on a hot plate to form anti-reflective coatings (film thickness 0.10 μm). The anti-reflective coatings were dipped in ethyl lactate and propylene glycol monomethyl ether being solvents used for photoresists.

The resulting anti-reflective coatings formed from Examples 1 to 8 and Comparative Example 3 were insoluble in these solvents. On the contrary, it was confirmed that the anti-reflective coatings formed from Comparative Examples 2 and 4 in which no crosslinking catalyst (pyridinium-p-toluene sulfonic acid) was contained were dissolved in these solvents.

Test of Intermixing with Photoresist

On the anti-reflective coatings (film thickness 0.23 μm) formed from the anti-reflective coating forming composition solutions prepared in Examples 1 to 8, a photoresist solution (manufactured by Tokyo Ohka Kogyo Co., Ltd., trade name: TARF-P6111) was coated by means of a spinner, and heated at 130° C. for 1 minute on a hot plate to form photoresist layers. After exposure of the photoresists to light, post exposure bake was performed at 130° C. for 1.5 minute. After developing the photoresists by use of 2.38 mass % tetramethyl ammonium hydroxide aqueous solution, the film thickness of the anti-reflective coatings was measured and it was confirmed that no intermixing occurred between the anti-reflective coatings and the photoresists.

Test of Optical Parameter

The anti-reflective coating forming composition solutions prepared in Examples 1 to 8 were coated on silicon wafer substrates by means of a spinner. The coated silicon wafer substrates were baked at 205° C. for 1 minute on a hot plate to form anti-reflective coatings (film thickness 0.06 μm). On the anti-reflective coatings, refractive index (n) and attenuation coefficient (k) at a wavelength of 193 nm were measured with a spectroscopic ellipsometer (manufactured by J. A. Woolam Co., Inc., VUV-VASE VU-302). The refractive index and attenuation coefficient of the anti-reflective coatings obtained from the anti-reflective coating forming composition of Examples 1 and 3 to 8 were 1.82 and 0.32, respectively. The refractive index and attenuation coefficient of the anti-reflective coating obtained from the anti-reflective coating forming composition of Example 2 were 1.69 and 0.55, respectively.

Measurement of Dry Etching Rate

The anti-reflective coating forming composition solutions prepared in Examples 1 and 2 were coated on silicon wafer substrates by means of a spinner. The coated silicon wafer substrates were baked at 205° C. for 1 minute on a hot plate to form anti-reflective coatings. Then, dry etching rate on these anti-reflective coatings was measured with RIE system ES401 manufactured by Nippon Scientific Co., Ltd. under the condition in which $CF_4$ was used as dry etching gas.

Similarly, a photoresist layer was formed on a silicon wafer substrate by means of a photoresist solution (trade name: PAR710 manufactured by Sumitomo Chemical Co., Ltd.). Then, dry etching rate was measured with RIE system ES401 manufactured by Nippon Scientific Co., Ltd. under the condition in which $CF_4$ was used as dry etching gas. The dry etching rate was compared between the anti-reflective coatings and the photoresist. The dry etching rate of the anti-reflective coating obtained from Example 1 was 1.78 time that of photoresist PAR710. The dry etching rate of the anti-reflective coating obtained from Example 2 was 1.53 time that of photoresist PAR710.

Observation of Photoresist Pattern Shape

From the anti-reflective coating forming composition solutions prepared in Examples 1 and 2 and Comparative Examples 1 and 3, anti-reflective coatings (film thickness 0.08 μm) were formed on a silicone wafer substrate, respectively. On these anti-reflective coatings, photoresist layers having a film thickness of 0.24 μm were formed by use of a photoresist solution (manufactured by JSR Corporation, trade name AR1221J). Then, the photoresist layers were exposed to light thorough a mask on which 90 nm line/space (L/S) pattern was depicted by use of PAS5500/1100 Scanner (wavelength 193 nm, NA, σ: 0.75, 0.89/0.59 (Annular)) manufactured by ASML. Thereafter, post exposure bake was performed at 130° C. for 1 minute on a hot plate, and then it was developed in 2.38 mass % tetramethyl ammonium hydroxide aqueous solution for 1 minute by single paddle process being industrial standard to form a photoresist pattern.

The cross-sectional shape of the resulting photoresist pattern was observed with a scanning electron microscope. The cross-sectional shape of the photoresist pattern formed by use of the solutions of Comparative Examples 1 and 3 in which no sulfonate compound (1,3-bis(p-toluenesutfonyloxy)propane) was contained had footing, in contrast with the cross-sectional shape of the photoresist pattern formed by use of the anti-reflective coating forming composition solutions of Examples 1 and 2 in which sulfonate compound (1,3-bis(p-toluenesulfonyloxy) propane) was contained.

Similarly to the above, the photoresist pattern was formed by use of the anti-reflective coatings forming composition solutions of Examples 3 to 8 in which sulfonate compound was contained. The observation of the resulting photoresist pattern with a scanning electron microscope showed that the cross-sectional shape thereof was rectangle.

The invention claimed is:

1. An anti-reflective coating forming composition for lithography comprising a polymer compound, a crosslinking compound, a crosslinking catalyst, a sulfonate compound and a solvent, wherein the sulfonate compound has a 10% weight loss temperature of 170° C. or more by thermogravimetry.

2. The anti-reflective coating forming composition for lithography according to claim 1, wherein the polymer compound is a polymer compound having an aromatic hydrocarbon ring structure selected from the group consisting of a benzene ring, a naphthalene ring and an anthracene ring.

3. The anti-reflective coating forming composition for lithography according to claim 1, wherein the polymer compound is a polymer compound having a nitrogen-containing ring structure selected from the group consisting of a triazine trione ring, an imidazolidine dione ring, 2,5-pyrrolidine dione ring and a pyrimidine trione ring.

4. The anti-reflective coating forming composition for lithography according to claim 1, wherein the polymer compound is a polymer compound having a repeated structural unit of formula (1):

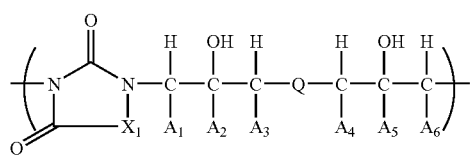

wherein $A_1$, $A_2$, $A_3$, $A_4$, $A_5$, and $A_6$ independently of one another are a hydrogen atom, methyl or ethyl, $X_1$ is a group of formula (2), (3) or (4):

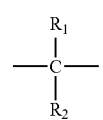

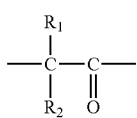

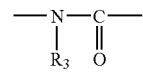

wherein
$R_1$ and $R_2$ independently of each other are a hydrogen atom, $C_{1-6}$alkyl, $C_{3-6}$alkenyl, benzyl or phenyl, and the phenyl may be substituted with a group selected from the group consisting of a $C_{1-6}$alkyl, halogen atom, $C_{1-6}$alkoxy, nitro, cyano, hydroxy and $C_{1-6}$alkylthio, or $R_1$ and $R_2$ may form $C_{3-6}$ring by linking each other,
$R_3$ is a $C_{1-6}$alkyl, $C_{3-6}$alkenyl, benzyl or phenyl, and the phenyl may be substituted with a group selected from the group consisting of a $C_{1-6}$alkyl, halogen atom, $C_{1-6}$alkoxy, nitro, cyano, hydroxy and $C_{1-6}$alkylthio,
Q is a group of formula (5) or (6):

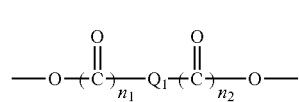

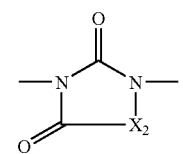

wherein
$Q_1$ is a $C_{1-10}$alkylene, phenylene, naphthylene or anthrylene, and each of the phenylene, naphthylene and anthrylene may be substituted with a group selected from the group consisting of a $C_{1-6}$alkyl, halogen atom, $C_{1-6}$alkoxy, nitro, cyano, hydroxy and $C_{1-6}$alkylthio,
each of $n_1$ and $n_2$ is a number of 0 or 1, and
$X_2$ is a group of formula (2) or (3).

5. The anti-reflective coating forming composition for lithography according to claim 1, wherein the crosslinking compound is a nitrogen-containing compound having a nitrogen atom substituted with hydroxymethyl or alkoxymethyl.

6. The anti-reflective coating forming composition for lithography according to claim 1, wherein the crosslinking catalyst is a sulfonic acid compound.

7. The anti-reflective coating forming composition for lithography according to claim 1, wherein the sulfonate compound is an alkylsulfonate compound having $C_{1-10}$alkyl.

8. The anti-reflective coating forming composition for lithography according to claim 1, wherein the sulfonate compound is an aromatic sulfonate compound.

9. The anti-reflective coating forming composition for lithography according to claim 8, wherein the aromatic sulfonate compound is a compound having a structure of formula (7):

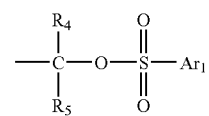

wherein

Ar$_1$ is a benzene ring, a naphthalene ring or an anthracene ring that may be substituted with a group selected from the group consisting of a C$_{1-6}$alkyl, C$_{1-6}$alkoxy, hydroxy, nitro, cyano, amino, halogen, carboxy and C$_{1-6}$alkoxy-carbonyl, and R$_4$ and R$_5$ independently of each other are a hydrogen atom or C$_{1-6}$alkyl, or R$_4$ and R$_5$ may form a C$_{3-8}$ring by linking each other.

10. The anti-reflective coating forming composition for lithography according to claim 9, wherein the aromatic sulfonate compound is a compound having two to four of the structure of formula (7).

11. The anti-reflective coating forming composition for lithography according to claim 8, wherein the aromatic sulfonate compound is a toluene sulfonate compound.

12. A method for forming a photoresist pattern for use in manufacturing a semiconductor device, the method comprising:

coating the anti-reflective coating forming composition according to claim 1 on a semiconductor substrate, baking the anti-reflective coating forming composition to form an anti-reflective coating, forming a photoresist layer on the anti-reflective coating, exposing the semiconductor substrate covered with the anti-reflective coating and the photoresist layer to light, and developing the photoresist layer after the exposure to light.

* * * * *